(12) United States Patent
Li et al.

(10) Patent No.: US 10,756,123 B2
(45) Date of Patent: Aug. 25, 2020

(54) ELECTROSTATIC DISCHARGE CIRCUIT AND MANUFACTURING METHOD THEREFOR, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Yang Li, Beijing (CN); Shuo Tang, Beijing (CN); Ying Meng, Beijing (CN); Bin Feng, Beijing (CN); Peng Sun, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/320,674

(22) PCT Filed: Apr. 11, 2018

(86) PCT No.: PCT/CN2018/082694
§ 371 (c)(1),
(2) Date: Jan. 25, 2019

(87) PCT Pub. No.: WO2018/214662
PCT Pub. Date: Nov. 29, 2018

(65) Prior Publication Data
US 2019/0165000 A1    May 30, 2019

(30) Foreign Application Priority Data
May 24, 2017   (CN) .......................... 2017 1 0374728

(51) Int. Cl.
*H01L 27/12*      (2006.01)
*H01L 23/498*     (2006.01)
(Continued)

(52) U.S. Cl.
CPC ...... *H01L 27/124* (2013.01); *H01L 21/76802* (2013.01); *H01L 21/76816* (2013.01);
(Continued)

(58) Field of Classification Search
CPC .............. H01L 27/124; H01L 27/0288; H01L 27/1244; H01L 27/0248; H01L 23/60;
(Continued)

(56) References Cited

U.S. PATENT DOCUMENTS

2007/0001947 A1    1/2007  Ki
2008/0284969 A1   11/2008  Lim
(Continued)

FOREIGN PATENT DOCUMENTS

CN        1893091 A      1/2007
CN      101308854 A     11/2008
(Continued)

OTHER PUBLICATIONS

International Search Report and Written Opinion in corresponding International Patent Application No. PCT/CN2018/082694 dated Jul. 17, 2018. 12 pages.
(Continued)

*Primary Examiner* — Joseph C. Nicely
(74) *Attorney, Agent, or Firm* — Leason Ellis LLP

(57) ABSTRACT

An electrostatic discharge circuit and a manufacturing method therefor, and a display apparatus. The electrostatic discharge circuit includes: a base substrate; at least one first signal line located on the base substrate, at least one second signal line and a first isolation layer, wherein the at least one first signal line and the at least one second signal line are insulated from each other by the first isolation layer; and a second isolation layer covering the at least one second signal line, wherein a via hole is provided on the at least one first signal line, the via hole penetrates through the first isolation
(Continued)

layer and the second isolation layer so that the at least one first signal line is located at the bottom of the via hole, and a part of the via hole is enclosed by the at least one second signal line.

15 Claims, 3 Drawing Sheets

(51) Int. Cl.
  *H01L 23/60* (2006.01)
  *H01L 27/02* (2006.01)
  *H01L 23/522* (2006.01)
  *H01L 23/48* (2006.01)
  *H01L 21/768* (2006.01)

(52) U.S. Cl.
  CPC ...... *H01L 21/76877* (2013.01); *H01L 23/481* (2013.01); *H01L 23/49827* (2013.01); *H01L 23/49838* (2013.01); *H01L 23/5226* (2013.01); *H01L 23/60* (2013.01); *H01L 27/0248* (2013.01); *H01L 27/0288* (2013.01); *H01L 27/1244* (2013.01); *H01L 2224/8211* (2013.01)

(58) Field of Classification Search
  CPC ......... H01L 23/49838; H01L 23/49827; H01L 23/481; H01L 23/5226; H01L 2224/8211; H01L 21/76816; H01L 21/76802; H01L 21/76877
  See application file for complete search history.

(56) References Cited

U.S. PATENT DOCUMENTS

| | | | |
|---|---|---|---|
| 2011/0211289 A1* | 9/2011 | Kosowsky | H01L 27/0288 361/91.1 |
| 2013/0277666 A1 | 10/2013 | Choi et al. | |
| 2014/0264709 A1* | 9/2014 | Tsai | H01L 23/481 257/459 |
| 2015/0241744 A1* | 8/2015 | Nakata | H01L 27/0296 349/42 |
| 2016/0103378 A1 | 4/2016 | Hashiguchi | |
| 2016/0293642 A1 | 10/2016 | Zhang et al. | |
| 2016/0351556 A1* | 12/2016 | Nakaiso | H01L 27/0805 |
| 2016/0358947 A1 | 12/2016 | Cai et al. | |
| 2017/0338203 A1* | 11/2017 | Yuan | H01L 25/0657 |
| 2019/0146291 A1* | 5/2019 | Liu | G02F 1/136259 257/72 |
| 2019/0165000 A1 | 5/2019 | Li et al. | |
| 2020/0043871 A1* | 2/2020 | Yang | H01L 27/1244 |

FOREIGN PATENT DOCUMENTS

| | | |
|---|---|---|
| CN | 104617106 A | 5/2015 |
| CN | 104716147 A | 6/2015 |
| CN | 104882452 A | 9/2015 |
| CN | 106960851 A | 7/2017 |

OTHER PUBLICATIONS

Chinese Office Action in corresponding Chinese Application No. 201710374728.4 dated Apr. 28, 2019 (an English translation attached hereto). 13 pages.

* cited by examiner

ELECTROSTATIC DISCHARGE CIRCUIT AND MANUFACTURING METHOD THEREFOR, AND DISPLAY APPARATUS

CROSS-REFERENCE TO RELATED APPLICATIONS

The present application is a U.S. National Stage Application under 35 U.S.C. § 371 of International Patent Application No. PCT/CN2018/082694, filed Apr. 11, 2018, which claims priority of Chinese Patent Application No. 201710374728.4 filed on May 24, 2017, the disclosures of which are incorporated herein by reference in their entireties.

TECHNICAL FIELD

Embodiments of the present disclosure relate to an electrostatic discharge circuit and a manufacturing method therefor, and a display apparatus.

BACKGROUND

In a display apparatus, wires in a peripheral region of the display apparatus may function for electrostatic discharge; however, in a local region where a large amount of electric charges are accumulated, there is still a risk of electrostatic breakdown, which seriously affects quality and yield of a product.

SUMMARY

Embodiments of the present disclosure provide an electrostatic discharge circuit and a manufacturing method thereof, and a display apparatus, which are capable of reducing a risk of electrostatic breakdown.

A first aspect of the present disclosure, it is provided an electrostatic discharge circuit, comprising: a base substrate; at least one first signal line, at least one second signal line, and a first isolation layer located on the base substrate, the at least one first signal line and the at least one second signal line being insulated from each other by the first isolation layer; and a second isolation layer covering the at least one second signal line, wherein a via hole is provided above the at least one first signal line, the via hole penetrates through the first isolation layer and the second isolation layer, the at least one first signal line is located at a bottom of the via hole, and a portion of the via hole is surrounded by the at least one second signal line.

A second aspect of the present disclosure, it is provided a display apparatus, comprising a display region and a non-display region, wherein the non-display region comprises the afore-mentioned electrostatic discharge circuit.

A third aspect of the present disclosure, it is provided a method for manufacturing an electrostatic discharge circuit, comprising: providing a base substrate; forming at least one first signal line, at least one second signal line and a first isolation layer on the base substrate, the at least one first signal line and the at least one second signal line being insulated from each other by the first isolation layer; forming a second isolation layer covering the at least one second signal line; and forming a via hole penetrating through the first isolation layer and the second isolation layer, the at least one first signal line is located at a bottom of the via hole, and a portion of the via hole is surrounded by the at least one second signal line.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
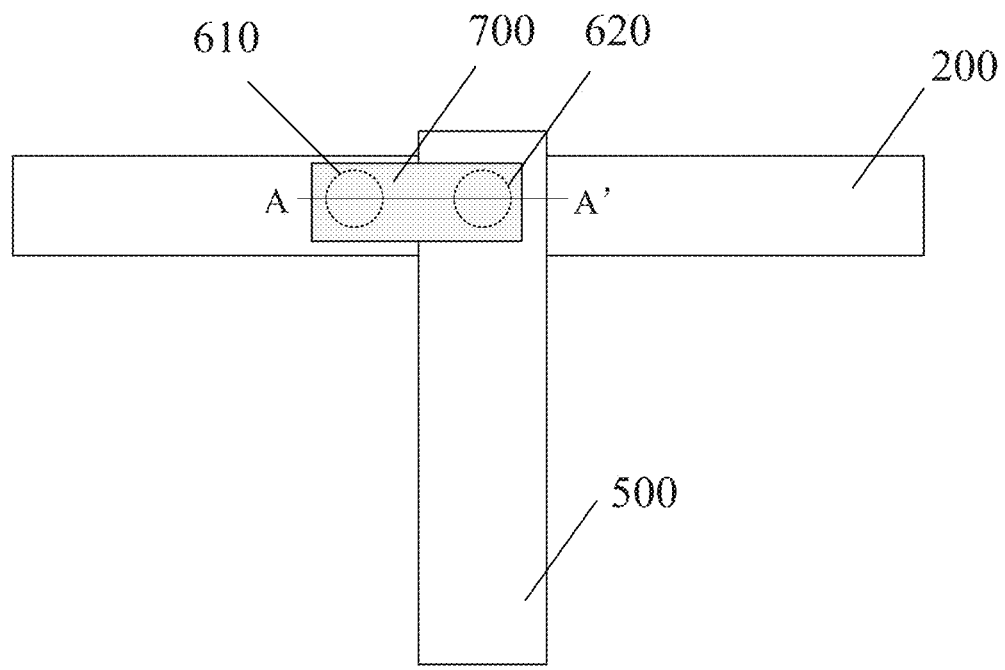
FIG. 1 is a simplified plan view of an electrostatic discharge circuit.
Figure 2:
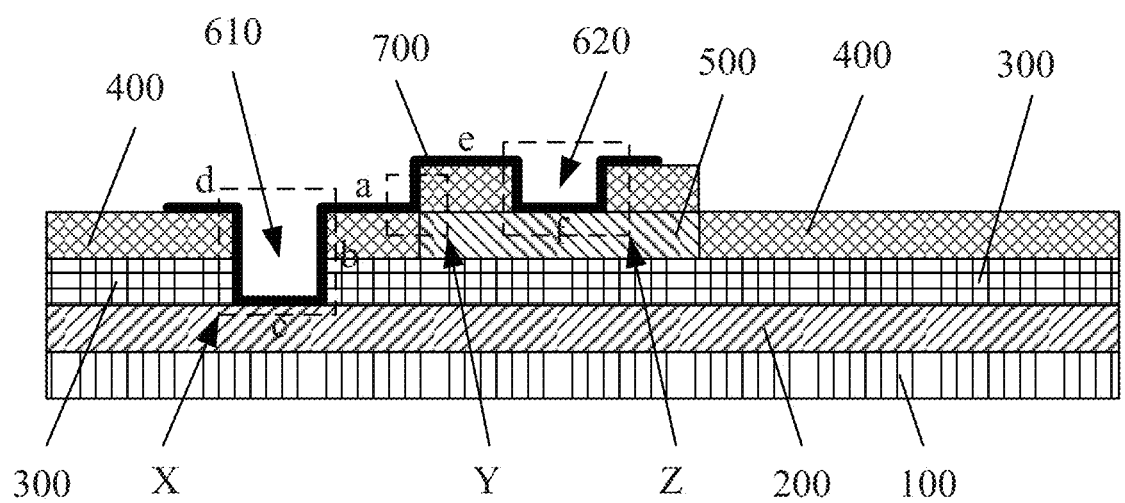
FIG. 2 is a partial cross-sectional view along line AA' of FIG. 1.

FIG. 1 is a simplified plan view of an electrostatic discharge circuit. As illustrated in FIG. 1, the electrostatic discharge circuit comprises a first signal line 200 and a second signal line 500 intersecting with each other. As illustrated in FIG. 2, on a glass substrate 100, the first signal line 200, a first isolation layer 300, a second isolation layer 400 and the second signal line 500 are provided. A via hole 610 exposes the first signal line 200, a via hole 620 exposes the second signal line 500, and the two via holes 610 and 620 are separated by the second isolation layer 400. A conductive layer 700 continuously covers the via holes 610 and 620 as well as a portion of the surface of the second isolation layer 400 located between the two via holes.

Usually, in a display apparatus, after the above-described glass substrate 100 is rubbed, electric breakdown is likely to occur at positions of region X, region Y and region Z of FIG. 1. This is because, in order to maintain balance of surface charges, electrons in the second signal line 500 continuously accumulate toward e and f, so that a potential difference is generated due to a difference in charge amount between position e and position f, and when the potential difference is greater than a breakdown voltage of the conductive layer 700, breakdown occurs at the position.

Similarly, a potential difference is generated due to a difference in charge amount between position c and positions d and a, and when the potential difference is greater than the breakdown voltage of the conductive layer 700, breakdown occurs at the position.

The position of region Y is most vulnerable to breakdown. A large amount of electrons accumulate at both positions a and e in region Y, but the amount of electrons accumulating through the signal line toward position e is much larger than that toward position a. The signal line at the position is generally connected with large pieces of metal and includes more electrons, whose amount of accumulation toward e is large. Moreover, the electron transport resistance of f→e is smaller (only a second isolation layer is present between e and f, while a first isolation layer and a second isolation layer are present between c and a) than the electron transport resistance of c→a, so that a potential difference between position a and position e is very large, and therefore, region Y is more vulnerable to breakdown than region X and region Z.

Figure 3:
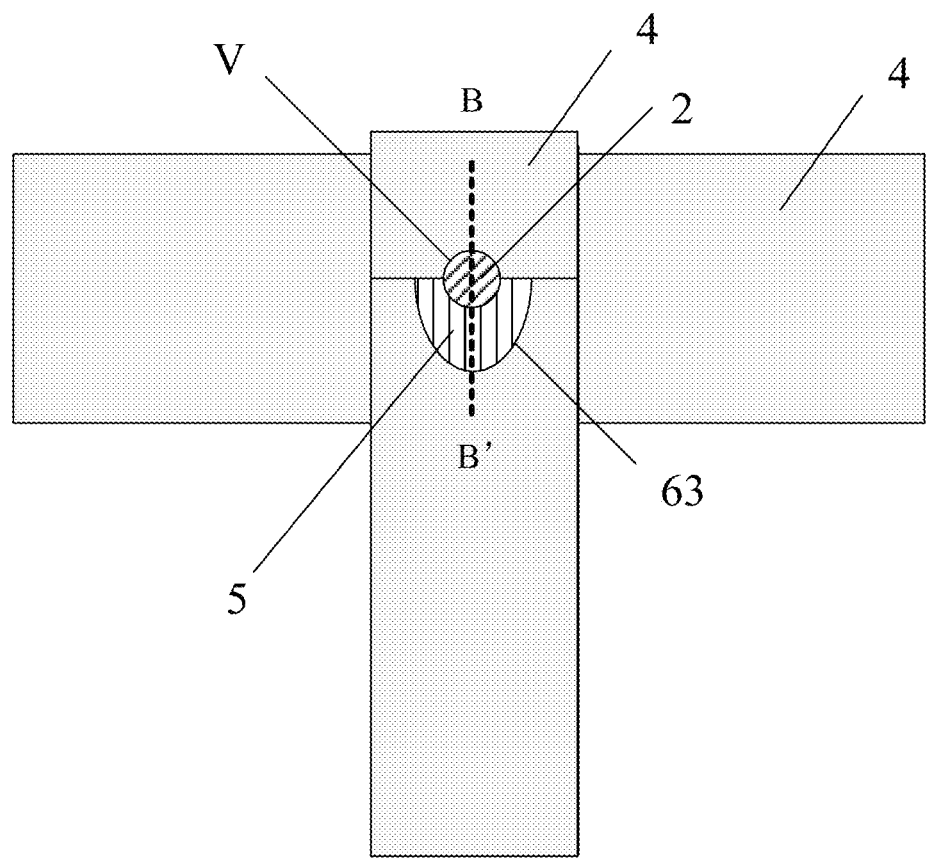
FIG. 3 is a plan view of an electrostatic discharge circuit according to an embodiment of the present disclosure.
Figure 4:
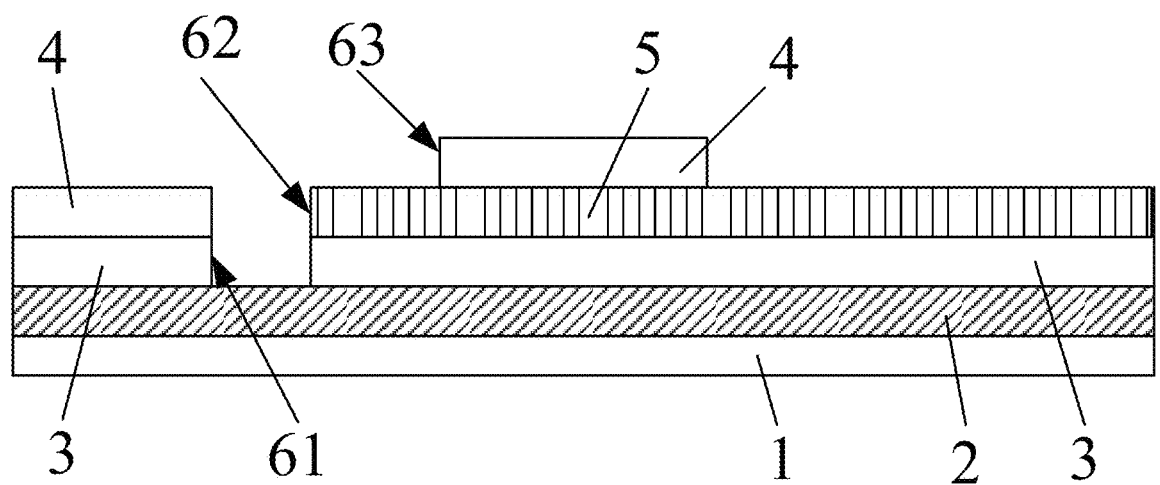
FIG. 4 is a partial cross-sectional view along line BB' of FIG. 1.

With reference to FIG. 3 to FIG. 4, an embodiment of the present disclosure provides an electrostatic discharge circuit, comprising: a base substrate 1; at least one first signal line 2, at least one second signal line 5, and a first isolation layer 3, all of which are located on the base substrate 1, the at least one first signal line 2 and the at least one second signal line 5 being insulated from each other by the first isolation layer 3; and a second isolation layer 4 covering the at least one second signal line 5. Herein, a via hole V is provided above the at least one first signal line 2, the via hole V penetrates through the first isolation layer 3 and the second isolation layer 4, so that the at least one first signal line 2 is located at a bottom of the via hole V, and a portion of the via hole V is surrounded by the at least one second signal line 5.

In the electrostatic discharge circuit according to the above-described embodiment, electrons in the first signal line 2 accumulate towards c, b, a and d. According to an electron transport distance and a resistance, electron accumulation amounts at the four positions are: c>b>a=d. Electrons in the second signal line 5 accumulate towards a, b, c and e, and according to an electron transport distance and a resistance, electron accumulation amounts at the four positions are: a=b>e≈c, so that electrons may transfer between a, b and c, and thus, a potential difference of the conductive layer 7 at connection position a of the second signal line 5 in region F is inevitably reduced, so that occurrence of breakdown at the position is prevented. Moreover, electron accumulation amounts are different between d and c and between a and c, and thus, a potential difference is generated, and even if the potential difference exceeds the breakdown voltage of the conductive layer 7, the breakdown does not affect direct conduction of the first signal line 2 and the second signal line 5, which also has a certain protective effect on region F in this way when electrons are discharged in an electrostatic portion.

Because a portion of the via hole V is directly constituted by the second signal line 5, a distance for electrical connection between the first signal line 2 and the second signal line 5 is reduced, and electrons may mutually transfer between the two signal lines, so as to reduce a potential difference at the connection position and prevent occurrence of electrostatic breakdown. When the conductive layer is fabricated subsequently, electrical connection between the two signal lines may be directly implemented through the conductive layer without passing through the second isolation layer.

In at least some embodiments, the via hole V includes a first via hole 61 located in the first isolation layer 3 and a second via hole 62 located in the second isolation layer 4, wherein, one half of the second via hole 62 is surrounded by the second isolation layer 4 and the other half is surrounded by the at least one second signal line 5. That is to say, a portion of an inner wall of the second via hole 62 close to the second isolation layer 4 is constituted by the second isolation layer 4, and another portion of the inner wall of the second via hole 62 close to the at least one second signal line 5 is constituted by the at least one second signal line 5.

Because a portion of the inner wall of the second via hole 62 is directly constituted by the second signal line 5, a distance for electrical connection between the first signal line 2 and the second signal line 5 is reduced, and electrons may mutually transfer between the two signal lines, so as to reduce a potential difference at the connection position and prevent occurrence of electrostatic breakdown. When a conductive layer is fabricated subsequently, electrical connection between the two signal lines may be directly implemented through the conductive layer without passing through the second isolation layer.

In at least some embodiments, an orthographic projection of the via hole V on the base substrate 1 seamlessly adjoins an orthographic projection of the at least one second signal line 5 on the base substrate 1. For example, as illustrated in FIG. 3, the second signal line 5 is hollowed out at a position corresponding to the via hole V, and therefore, there is no gap between the orthogonal projections of the two.

In at least some embodiments, an opening 63 is provided above the at least one second signal line 5, the opening 63 and the via hole V are in communication with each other, and the at least one second signal line 5 is located at a bottom of the opening 63, for example, as illustrated in FIG. 3. The opening 63 is formed as being enclosed by the second isolation layer 4, which, together with the via hole V, constitutes a semi-via hole structure; the design further reduces a distance for electrical connection between the first signal line 2 and the second signal line 5, and electrons may mutually transfer between the two signal lines, so as to reduce a potential difference at the connection position and prevent occurrence of electrostatic breakdown. It may be understood that shapes of the opening 63 and the via hole V are not merely limited to the shapes (a circle and a semi-ellipsoid) illustrated in FIG. 3.

Because the second isolation layer 4 further covers the second signal line 5, the second signal line 5 may be protected from being scratched. In addition, since there are two isolation layers above the first signal line 2, the first signal line may be further protected from being scratched.

In at least some embodiments, an orthographic projection of the opening 63 on the base substrate 1 seamlessly adjoins an orthographic projection of the via hole on the base substrate 1. For example, as illustrated in FIG. 3, the opening 63 and the via hole V are in communication with each other, and therefore, there is no gap between the orthogonal projections of the two.

Figure 5:
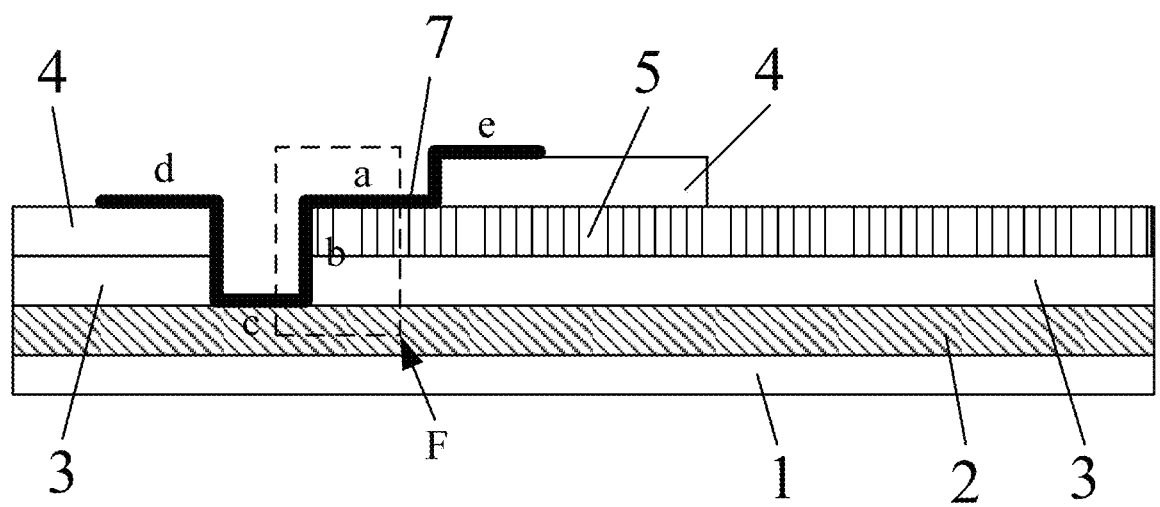
FIG. 5 is a partial cross-sectional view of an electrostatic discharge circuit comprising a conductive layer according to another embodiment of the present disclosure.

In at least some embodiments, the electrostatic discharge circuit further comprises a conductive layer 7. Herein, the conductive layer 7 continuously covers at least a bottom of the via hole V, an inner wall of the via hole V close to the second signal line 5, and a bottom of the opening 63, such that the at least one first signal line 2 located at the bottom of the via hole V and the at least one second signal line 5 located at the bottom of the opening 63 are in electrical connection with each other through the conductive layer 7. The conductive layer 7 is, for example, an ITO layer. For example, as illustrated in FIG. 5, the conductive layer 7 at least continuously covers and contacts the bottom of the via hole V, the bottom of the opening 63, and the inner wall on a side of the via hole V close to the second signal line 5, such that the first signal line 2 and the second signal line 5 may be conducted only through the conductive layer 7. That is to say, the two signal lines are spaced by only one first isolation layer 3, without any second isolation layer 4.

Another embodiment of the present disclosure provides a display apparatus, comprising a display region and a non-display region. Here, the non-display region includes the electrostatic discharge circuit according to any one of the above-described embodiments.

In at least some embodiments, the at least one first signal line includes a plurality of gate lines, the at least one second signal line includes a plurality of leads, the first isolation layer is a gate insulating layer, and the second isolation layer is a passivation layer.

In at least some embodiments, a signal transmitted in each gate line is transmitted to one of the plurality of leads directly through a conductive layer of the electrostatic discharge circuit.

In the display apparatus according to the above-described embodiment, since a portion of the via hole V is directly constituted by the lead, so that a distance for electrical connection between the gate line and the lead is reduced, electrons may mutually transfer between the gate line and the lead, so as to reduce a potential difference at a connection point and prevent occurrence of electrostatic breakdown. When a conductive layer is fabricated subsequently, electrical connection between the gate line and the lead may be directly implemented through the conductive layer without passing through the second isolation layer.

Hereinafter, an example of the electrostatic discharge circuit used in the display apparatus will be described in detail.

As illustrated in FIG. 3 to FIG. 5, the electrostatic discharge circuit used in the display apparatus comprises: a base substrate 1; a gate line 2 and a gate electrode located on the base substrate 1, the gate line 2 extending along a first direction (for example, a horizontal direction) and provided in a same layer as the gate electrode; a gate insulating layer 3 including a first via hole 61, which is provided on the base substrate 1 and covers both the gate line 2 and the gate electrode; a lead 5 (connected with a source electrode or a drain electrode of a thin film transistor) located on the gate insulating layer 3, the lead 5 extending along a second direction (for example, a vertical direction); and a passivation layer 4 including a second via hole 62, which is provided on the gate insulating layer 3 and covers the lead 5. Here, a distance between an orthographic projection of the second via hole 62 on the base substrate 1 and an orthographic projection of the lead 5 on the base substrate 1 in the first direction is zero, and an orthographic projection of the first via hole 61 on the base substrate 1 coincides with the orthographic projection of the second via hole 62 on the base substrate 1, and overlaps with an orthographic projection of the gate line 2 on the base substrate 1; and a conductive layer 7, provided on inner surfaces of the first via hole 61 and the second via hole 62, the conductive layer 7 electrically connecting the gate line 2 with the lead 5 through the first via hole 61 and the second via hole 62. The first direction and the second direction are perpendicular to each other. It may be understood that, the first direction and the second direction may be set to other modes than perpendicular mode, for example, an included angle between the two is approximately 30 degrees, 45 degrees, 60 degrees, and the like, which will not influence an effect of the present disclosure.

In the display apparatus according to the above-described embodiment, because the lead 5 and the gate line 2 are directly connected through the conductive layer 7 within the first via hole 61 and the second via hole 62, it is not necessary for the conductive layer 7 to extend across the passivation layer 4, and a transport distance thereof is reduced (directly transported from c to b), and the number of electrons on the conductive layer 7 within the first via hole 61 and the second via hole 62 is reduced, so that a potential difference of the conductive layer 7 at the connection position of the gate line 2 and the lead 5 is relatively small, which can effectively prevent the conductive layer 7 from being broken down by static electricity.

Optionally, the passivation layer 4 further includes an opening 63; a distance between an orthographic projection of the opening 63 on the base substrate 1 and an orthographic projection of the second via hole 62 on the base substrate 1 in the first direction is zero (the opening 63 and the second via hole 62 are communicated with each other at one side of the opening 63 adjacent to the second via hole 62). The orthographic projection of the opening 63 on the base substrate 1 overlaps with the orthographic projection of the lead 5 on the base substrate 1. The opening 63 and the second via hole 62 are communicated with each other at one side of the opening 63 adjacent to the second via hole 62. The conductive layer 7 extends into the opening 63 and is electrically connected with the lead 5 exposed on an inner bottom surface of the opening 63, that is, the conductive layer 7 electrically connects the gate line 2 with the lead 5 through the first via hole 61, the second via hole 62 and the opening 63, and at a same time, it is not necessary for the conductive layer 7 to extend across the passivation layer 4. As compared with the prior art, the transport distance of the passivation layer 4 between the gate line 2 and the lead 5 is omitted, so that the electrons transport distance is shortened.

A portion of an upper surface of the gate line 2 is exposed on an inner bottom surface of the first via hole 61, a portion of a side surface of the lead 5 is exposed on an inner side surface of the second via hole 62, and a portion of an upper surface of the lead 5 is exposed on an inner bottom surface of the opening 63.

As illustrated in FIG. 3, the orthographic projection of the gate line 2 on the base substrate 1 and the orthographic projection of the lead 5 on the base substrate 1 are perpendicular to each other; the conductive layer 7 is made of, for example, indium tin oxide (ITO); the orthographic projection of the second via hole 62 on the base substrate 1 has a shape of a circle, and an outer circumference of a half of the circle adjoins the orthographic projection of the lead 5 on the base substrate 1, so as to increase a contact area of the conductive layer 7 with the side surface of the lead 5, which is more favorable for electron transport.

As illustrated in FIG. 4 and FIG. 5, the first via hole 61 and the second via hole 62 have a same shape, and have a same area. The first via hole 61, the second via hole 62 and the opening 63 may be fabricated respectively, and may also be fabricated simultaneously, both of which may achieve the objective of the present disclosure. It is contemplated that the first via hole 61 and the second via hole 62 may also be a rectangular hole, a trapezoid hole, or other shapes, all of which may achieve the objective of the present disclosure.

It may be understood that, the display apparatus usually comprises a plurality of the gate lines 2 and a plurality of the leads 5, and therefore, a plurality of groups (for example, two groups, three groups, four groups, and the like) of the first via hole 61 and the second via hole 62 and the opening 63 may be provided in the non-display region, which will not be described in detail here.

In the display apparatus according to the above-described embodiment, electrons in the gate line 2 accumulate towards c, b, a and d. According to an electron transport distance and a resistance, electron accumulation amounts at the four positions are: c>b>a=d. Electrons in the lead 5 accumulate towards a, b, c and e. According to an electron transport distance and a resistance, electron accumulation amounts at the four positions are: a=b>e≈c, so that electrons may transfer between a, b and c, and thus, a potential difference of the conductive layer 7 at connection position a of the second signal line 5 in region F is inevitably reduced, so that occurrence of breakdown at the position is prevented. Moreover, electron accumulation amounts are different between d and c and between a and c, and thus, a potential difference is generated, and even if the potential difference exceeds the breakdown voltage of the conductive layer 7, the breakdown does not affect direct conduction of the gate line 2 and the lead 5, which also has a certain protective effect on region F in this way when electrons are discharged in an electrostatic portion.

A further embodiment of the present disclosure provides a manufacturing method of an electrostatic discharge circuit, comprising:

Providing a base substrate 1;

Forming at least one first signal line 2, at least one second signal line 5 and a first isolation layer 3 on the base substrate 1, the at least one first signal line 2 and the at least one second signal line 5 being insulated from each other by the first isolation layer 3;

Forming a second isolation layer 4 covering the at least one second signal line 5; and Forming a via hole V penetrating through the first isolation layer 3 and the second isolation layer 4, so that the at least one first signal line 2 is located at a bottom of the via hole V, and a portion of the via hole V is surrounded by the at least one second signal line 5.

In at least some embodiments, the forming a via hole V penetrating through the first isolation layer 3 and the second isolation layer 4 includes: forming a first via hole 61 in the first isolation layer 3 and forming a second via hole 62 in the second isolation layer 4, herein, one half of the second via hole 62 is surrounded by the second isolation layer 4, and the other half is surrounded by the at least one second signal line 5.

In at least some embodiments, a portion of an inner wall of the second via hole 62 close to the second isolation layer 4 is constituted by the second isolation layer 4, and another portion of the inner wall of the second via hole 62 close to the at least one second signal line 5 is constituted by the at least one second signal line 5.

In at least some embodiments, an orthographic projection of the via hole V on the base substrate 1 seamlessly adjoins an orthographic projection of the at least one second signal line 5 on the base substrate 1.

In at least some embodiments, an opening 63 is formed in the second isolation layer, the opening 63 and the via hole V are in communication with each other, and the at least one second signal line 5 is located at a bottom of the opening 63.

In at least some embodiments, an orthographic projection of the opening 63 on the base substrate 1 seamlessly adjoins an orthographic projection of the via hole V on the base substrate 1.

In at least some embodiments, the above-described manufacturing method further comprises: forming a conductive layer, herein, the conductive layer at least covers the at least one first signal line 2 located at a bottom of the via hole V and the at least one second signal line 5 located at a bottom of the opening 63. The conductive layer is, for example, a conductive layer 7.

Hereinafter, a method for manufacturing an electrostatic discharge circuit used in a display apparatus is provided. The method comprises:

Sequentially forming a gate line 2 and a gate electrode, a gate insulating layer 3, a lead 5 and a passivation layer 4 on a base substrate 1, the gate line 2 being provided in a same layer as the gate electrode, the gate line 2 extending along a first direction (for example, a horizontal direction), and the lead 5 extending along a second direction (for example, a vertical direction);

Forming a second via hole 62 in the passivation layer 4 and forming a first via hole 61 in the gate insulating layer 3, herein, a distance between an orthographic projection of the second via hole 62 on the base substrate 1 and an orthographic projection of the lead 5 on the base substrate 1 in the first direction is zero, and an orthographic projection of the first via hole 61 on the base substrate 1 coincides with the orthographic projection of the second via hole 62 on the base substrate 1, and overlaps with an orthographic projection of the gate line 2 on the base substrate 1.

Optionally, the method further comprises: forming a conductive layer 7 on inner surfaces of the first via hole 61 and the second via hole 62, and electrically connecting, by the conductive layer 7, the gate line 2 with the lead 5 through the first via hole 61 and the second via hole 62; that is, the gate line 2 is connected with the lead 5 through the conductive layer 7 within the first via hole 61 and the second via hole 62, and it is not necessary for the conductive layer 7 to extend across the passivation layer 4, which shortens a length of the conductive layer 7, and reduces an electron transport distance, so that a potential difference of the conductive layer 7 at a connection position of the signal line and the lead 5 is relatively small, which can effectively prevent the conductive layer 7 from being broken down by static electricity.

Optionally, the method further comprises: forming an opening 63 in the passivation layer 4, herein, a distance between an orthographic projection of the opening 63 on the base substrate 1 and an orthographic projection of the second via hole 62 on the base substrate 1 in the first direction is zero (the opening 63 and the second via hole 62 are communicated with each other at one side of the opening 63 adjacent to the second via hole 62); and the orthographic projection of the opening 63 on the base substrate 1 overlaps with the orthographic projection of the lead 5 on the base substrate 1.

Optionally, the conductive layer 7 is fabricated simultaneously on the inner surfaces of the first via hole 61 and the second via hole 62 as well as within the opening 63, so that the gate line 2 is electrically connected with the lead 5 through the conductive layer 7 located in the first via hole 61, the second via hole 62 and the opening 63. The conductive layers 7 within the second via hole 62 and the opening 63 are connected with each other at communication part of the opening 63, so that electrons are transported on the conductive layer 7 without extending across the passivation layer 4 (the lead 5 is connected with the gate line 2 through the conductive layer 7 within the first via hole 61, the second via hole 62 and the opening 63).

In at least some embodiments, the conductive layer 7 may be fabricated by chemical plating or electroplating a film, and then the film is developed and etched; in order to avoid a problem of overetching, the conductive layer 7 may be left on a peripheral outer surface of the second via hole 62 and on a peripheral outer surface of the opening 63 (that is, left at positions d and e on a passivation layer 4, as illustrated in FIG. 5). The term "overlap" may refer to that the orthographic projection of the opening 63 on the base substrate partially overlaps with the orthographic projection of the lead 5 on the base substrate, and may also refer to that the orthographic projection of the opening 63 on the base substrate completely overlaps with the orthographic projection of the lead 5 on the base substrate. Because a transport distance between the gate line and the lead is reduced (directly transported from c to b without passing through the passivation layer), a potential difference of the conductive layer at a connection position of two signal lines is relatively small, which can effectively prevent the conductive layer from being broken down by static electricity.

In the disclosure, the following should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:

1. An electrostatic discharge circuit, comprising:
a base substrate;
at least one first signal line, at least one second signal line, and a first isolation layer located on the base substrate, the at least one first signal line and the at least one second signal line being insulated from each other by the first isolation layer, and
a second isolation layer covering the at least one second signal line,
wherein a via hole is provided above the at least one first signal line, the via hole penetrates through the first isolation layer and the second isolation layer, the at least one first signal line is located at a bottom of the via hole, and a portion of the via hole is surrounded by the at least one second signal line,
wherein the via hole comprises a first via hole located in the first isolation layer and a second via hole located in the second isolation layer, wherein one half of the second via hole is surrounded by the second isolation layer and the other half is surrounded by the at least one second signal line.

2. The electrostatic discharge circuit according to claim 1, wherein a portion of an inner wall of the second via hole close to the second isolation layer is constituted by the second isolation layer, and another portion of the inner wall of the second via hole close to the at least one second signal line is constituted by the at least one second signal line.

3. The electrostatic discharge circuit according to claim 1, wherein an orthographic projection of the via hole on the base substrate seamlessly adjoins an orthographic projection of the at least one second signal line on the base substrate.

4. The electrostatic discharge circuit according to claim 1, wherein an opening is provided above the at least one second signal line, the opening and the via hole are in communication with each other, and the at least one second signal line is located at a bottom of the opening.

5. The electrostatic discharge circuit according to claim 4, wherein an orthographic projection of the opening on the base substrate seamlessly adjoins an orthographic projection of the via hole on the base substrate.

6. The electrostatic discharge circuit according to claim 4, further comprising a conductive layer, wherein the conductive layer continuously covers at least the bottom of the via hole, covers an inner wall of the via hole close to the at least one second signal line, and covers the bottom of the opening, such that the at least one first signal line located at the bottom of the via hole and the at least one second signal line located at the bottom of the opening are in electrical connection with each other through the conductive layer.

7. A display apparatus, comprising a display region and a non-display region, wherein the non-display region comprises the electrostatic discharge circuit according to claim 1.

8. The display apparatus according to claim 7, wherein the at least one first signal line comprises a plurality of gate lines, the at least one second signal line comprises a plurality of leads, the first isolation layer is a gate insulating layer, and the second isolation layer is a passivation layer.

9. The display apparatus according to claim 8, wherein a signal transmitted in each gate line is transmitted to one of the plurality of leads directly through a conductive layer of the electrostatic discharge circuit.

10. A method for manufacturing an electrostatic discharge circuit, comprising:
providing a base substrate;
forming at least one first signal line, at least one second signal line and a first isolation layer on the base substrate, the at least one first signal line and the at least one second signal line being insulated from each other by the first isolation layer,
forming a second isolation layer covering the at least one second signal line; and
forming a via hole penetrating through the first isolation layer and the second isolation layer, the at least one first signal line is located at a bottom of the via hole, and a portion of the via hole is surrounded by the at least one second signal line,
wherein the forming a via hole penetrating through the first isolation layer and the second isolation layer comprises: forming a first via hole in the first isolation layer and forming a second via hole in the second isolation layer, wherein one half of the second via hole is surrounded by the second isolation layer, and the other half is surrounded by the at least one second signal line.

11. The method according to claim 10, wherein a portion of an inner wall of the second via hole close to the second isolation layer is constituted by the second isolation layer, and another portion of the inner wall of the second via hole close to the at least one second signal line is constituted by the at least one second signal line.

12. The method according to claim 10, wherein an orthographic projection of the via hole on the base substrate seamlessly adjoins an orthographic projection of the at least one second signal line on the base substrate.

13. The method according to claim 10, wherein an opening is formed in the second isolation layer, the opening and the via hole are in communication with each other, and the at least one second signal line is located at a bottom of the opening.

14. The method according to claim 13, wherein an orthographic projection of the opening on the base substrate seamlessly adjoins an orthographic projection of the via hole on the base substrate.

15. The method according to claim 13, further comprising: forming a conductive layer, wherein the conductive layer continuously covers at least the bottom of the via hole, covers an inner wall of the via hole close to the second signal line, and covers the bottom of the opening, such that the at least one first signal line located at the bottom of the via hole and the at least one second signal line located at the bottom of the opening are in electrical connection with each other through the conductive layer.

* * * * *